(12) United States Patent
Grötsch (10) Patent No.: US 8,494,337 B2
(45) Date of Patent: Jul. 23, 2013

(54) LIGHT GUIDE

(75) Inventor: Stefan Grötsch, Abbach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 706 days.

(21) Appl. No.: 11/816,947

(22) PCT Filed: Feb. 2, 2006

(86) PCT No.: PCT/DE2006/000157
§ 371 (c)(1),
(2), (4) Date: Jan. 8, 2008

(87) PCT Pub. No.: WO2006/089503
PCT Pub. Date: Aug. 31, 2006

(65) Prior Publication Data
US 2009/0129230 A1    May 21, 2009

(30) Foreign Application Priority Data

Feb. 28, 2005 (DE) .......................... 10 2005 009 028
Apr. 20, 2005 (DE) .......................... 10 2005 018 336

(51) Int. Cl.
*G02B 6/00* (2006.01)
(52) U.S. Cl.
USPC ....................................................... 385/146
(58) Field of Classification Search
USPC ................................................ 385/146, 133
See application file for complete search history.

(56) References Cited

U.S. PATENT DOCUMENTS

| | | | |
|---|---|---|---|
| 4,765,718 A | 8/1988 | Henkes | |
| 4,950,059 A | 8/1990 | Roberts | |
| 5,271,077 A * | 12/1993 | Brockman et al. | 385/31 |
| 5,523,557 A | 6/1996 | Bruno | |
| 5,652,812 A | 7/1997 | Gurib et al. | |
| 6,189,505 B1 | 2/2001 | Reid | |
| 6,264,376 B1 * | 7/2001 | Savage, Jr. | 385/88 |
| 6,819,505 B1 | 11/2004 | Cassarly et al. | |
| 6,885,808 B2 * | 4/2005 | Hatakoshi | 385/146 |
| 7,171,104 B2 * | 1/2007 | Tamura et al. | 385/146 |
| 7,379,651 B2 * | 5/2008 | Abu-Ageel | 385/146 |
| 2003/0222772 A1 | 12/2003 | Laufer | |
| 2004/0037507 A1 | 2/2004 | Marion et al. | |
| 2005/0007346 A1 | 1/2005 | Ma et al. | |
| 2005/0254771 A1 | 11/2005 | Yamashita et al. | |
| 2006/0018010 A1 * | 1/2006 | Blumel | 359/351 |

FOREIGN PATENT DOCUMENTS

| | | |
|---|---|---|
| DE | 19907553 | 9/2000 |
| DE | 10314254 | 10/2004 |
| DE | 102004011987 | 2/2005 |

(Continued)

OTHER PUBLICATIONS

Hamilton, D., "Subcompact field Optics for Far-Infrared/Submillimeter", *Applied Optics*, vol. 25, No. 4, pp. 537-539, 1986.

(Continued)

*Primary Examiner* — Eric Wong
(74) *Attorney, Agent, or Firm* — Fish & Richardson P.C.

(57) ABSTRACT

A light guide is provided. The light guide has an uneven light input face and even side faces, which are arranged directly downstream of the light input face. Furthermore, an optoelectronic component with such a light guide is provided.

25 Claims, 4 Drawing Sheets

FOREIGN PATENT DOCUMENTS

| | | |
|---|---|---|
| EP | 0 534 853 | 9/1992 |
| EP | 1213773 | 6/2002 |
| EP | 1306697 | 5/2003 |
| EP | 1434277 | 6/2004 |
| EP | 1450183 | 8/2004 |
| EP | 1462829 | 9/2004 |
| EP | 1512999 | 3/2005 |
| JP | 08075935 | 3/1996 |
| JP | 9-121072 | 5/1997 |
| JP | 2000-180962 | 6/2000 |
| JP | 2000-133904 | 12/2000 |
| JP | 2001023423 | 1/2001 |
| JP | 2003-330109 | 11/2003 |
| JP | 2004-209259 | 7/2004 |
| JP | 2005-031667 | 2/2005 |
| TW | 369610 | 9/1999 |
| TW | 1225947 | 1/2005 |
| WO | WO 02/50472 | 6/2002 |
| WO | WO03/098100 | 11/2003 |
| WO | WO 2004/097946 | 11/2004 |

OTHER PUBLICATIONS

Schnitzer, I. and Yablonovich, E., "30% External Quantum Efficiency from Surface Textured, Thin-film Light-emitting Diodes", *Appl. Phys. Lett.*, vol. 63, No. 16, pp. 2174-2176, 1993.

International Search Report for PCT/DE2006/000157, dated Jun. 1, 2006.

Translation of Preliminary Notice of Rejection for Application No. 095106673 dated Jul. 5, 2007.

Japan Patent Office, "Translation of the Notification of Reasons for Refusal", JP Pat. Appl. No. 2007-557314, mailed on Jul. 6, 2011 (4 pages).

J. Bourhis, "Notice pursuant to Article 94(3) EPC", EP Application No. 06 705 886.7, issued on Jun. 5, 2012 (5 pages).

"Translation of the Decision of Refusal", JP Patent Application No. 2007-557314, issued on Mar. 12, 2012 (4 pages).

"Translation of the Board of Appeal's Request for Written Agreement", JP Pat. Appl. No. 2007-557314, issued on Sep. 21, 2012 (5 pages).

* cited by examiner

LIGHT GUIDE

CROSS-REFERENCE TO RELATED APPLICATIONS

This application is the National Stage of International Application No. PCT/DE2006/000157, filed on Feb. 2, 2006, which claims the priority to German Patent Applications Serial No. 102005009028.1, filed on Feb. 28, 2005 and Serial No. 102005018336.0, filed on Apr. 20, 2005. The contents of all applications are hereby incorporated by reference in their entireties.

FIELD OF THE INVENTION

A light guide is provided. Furthermore, an optoelectronic component is provided.

BACKGROUND

The document U.S. Pat. No. 4,765,718 describes a light guide.

SUMMARY

One object to be achieved is to provide a light guide which can guide electromagnetic radiation with particularly little loss. A further object to be achieved is to provide an optoelectronic component with such a light guide.

A light guide is provided. A light guide is to be understood as meaning an optical component which is suitable for guiding electromagnetic radiation from one place to another. The guiding of the electromagnetic radiation in this case preferably takes place by reflections at the side faces bounding the light guide.

According to at least one embodiment of the light guide, the light guide has an uneven light input face. A light input face is to be understood here as meaning that part of the surface of the light guide which is intended for the coupling of electromagnetic radiation into the light, guide. For example, a radiation source which is suitable for generating electromagnetic radiation may be arranged in the vicinity of the light input face. At least part of the electromagnetic radiation emitted by the radiation source enters the light guide through the light input face and is carried away from the latter by the light guide. The light input face is preferably uneven. The unevenness of the light input face relates here to macroscopic unevennesses. In particular, this means that the light input face is not formed as a planar face, but has for example at least one macroscopic recess and/or macroscopic elevation.

The unevenness of the light input face is preferably chosen here such that the coupling of light into the light guide is improved on account of the unevenness. This may mean, for example, that a greater proportion of the electromagnetic radiation generated by a radiation source can enter the light guide than would be the case with an even light input face. It may also mean that the direction of the electromagnetic rays entering the light guide is at least partially changed on account of the unevenness of the light input face. This allows the effect to be achieved, for example, that the coupled-in radiation remains longer in the light guide and does not leave it again in the direct vicinity of the light input face. The light guide preferably has in this case a single light input face.

According to at least one embodiment of the light guide, the light guide has side faces. Side faces are to be understood here as meaning parts of the surface of the light guide that laterally bound the light guide. A large part of the electromagnetic radiation which is coupled into the light guide and impinges on a side face is preferably reflected by the latter. The reflection may take place for example by means of total reflection at the side face. If the radiation impinging on the side faces does not satisfy the condition for total reflection, the electromagnetic radiation leaving the light guide passes at the side faces from the optically denser medium—with the greater refractive index—into the optically thinner medium with the smaller refractive index. However, it is also possible for the side faces to be made reflective, for instance by means of a reflective coating.

The side faces are preferably even, at least in places. That is to say that the side faces have no macroscopic recesses, elevations or curvatures, but are formed as planar faces. That is to say that the side faces are formed macroscopically smooth.

The even side faces are preferably arranged directly downstream of the light input face. The even side faces therefore directly adjoin the part of the surface of the light guide that contains the light input face. The side faces can in this case laterally enclose the light input face. It is also possible for the side faces to directly adjoin the light input face.

According to at least one embodiment of the light guide, the light guide has an uneven light input face and even side faces, which are arranged directly downstream of the light input face. The light guide thereby makes use of the idea that radiation entering the light guide is refracted in a defined way on account of the unevenness of the light input face. Part of the radiation coupled into the light guide through the light input face then impinges on one of the even side faces arranged directly downstream of the light input face and is reflected by the said side face, at least predominantly, into the light guide. In this way, a particularly great proportion of the radiation emitted by a radiation source can be coupled into the light guide and kept in it until it reaches a light output face of the light guide provided for light output.

According to at least one embodiment of the light guide, the cross-sectional area of the light guide increases with the distance from the light input face. The cross-sectional area at a given distance from the light input face is given by the line of intersection of the side faces of the light guide with a plane which is located at this distance from the light input face. The cross-sectional area is in this case the smallest possible area that intersects the side faces bounding the light guide at a specific distance from the light input face.

An expansion of the cross-sectional area of the light guide with the distance from the light input face can be achieved for example by the light guide having a frustoconical or frustopyramidal form. The light input face is in this case arranged on the side of the light guide that is facing away from the base of the frustum.

According to at least one embodiment of the light guide, the cross-sectional area of the light guide increases more in a first portion of the light guide than in a second portion of the light guide. "Increases more" means for example that, in a comparison of two pieces of the light guide of equal length, the area content of the cross-sectional area in the radiating direction in the case of a piece which lies in the first portion increases by a greater percentage than in the case of a piece which lies in the second portion. It may also mean that, up to a specific first distance from the light input face, the cross-sectional area increases more than from this first distance to a second distance from the light input face. The light guide is then divided into at least two portions: a first portion, from the light input face to a prescribed distance from the light input face, in which the cross-sectional area increases more than in a second portion, which is arranged downstream in the radiation direction of the first portion.

According to at least one embodiment of the light guide, the first portion is arranged directly downstream of the light input face of the light guide. That is to say that, at least in this first portion, the side faces of the light guide can be evenly formed.

According to at least one embodiment of the light guide, the increase in the cross-sectional area with the distance from the light input face in the first portion of the light guide is realized by the side faces of the light guide in each case forming a first angle with the cross-sectional area of the light guide. The first angles are in this case greater than 90 degrees. For example, the first angles for each side face may be chosen to be equal in size.

According to at least one embodiment of the light guide, the side faces in the second portion of the light guide form second angles with the cross-sectional area of the light guide.

According to at least one embodiment of the light guide, the first angles are greater than the second angles. This allows the effect to be achieved that the cross-sectional area of the light guide increases more in the first portion then in the second portion. For example, the light guide may be constructed in such a way that a first frustum of a pyramid forms the first portion of the light guide. The first frustum of a pyramid is adjoined for example by a second frustum of a pyramid. The light guide is then configured overall in the form of two frustums of a pyramid arranged in series one against the other. In this case, the side faces of the first frustum of a pyramid form a greater angle with the cross-sectional area than the second faces of the second frustum of a pyramid.

In addition, however, other forms are also possible for the first and second portions of the light guide. For example, the light guide may also take the form of two frustums of a cone arranged one behind the other.

Furthermore, the light guide may have more than two portions. For example, the second portion may be adjoined on its side facing away from the light input face by a third portion. In the third portion, the side faces may form third angles with the cross-sectional area, which are for example smaller than the second angles.

The light guide makes use of the idea, inter alia, of arranging at least two optical concentrators one behind the other. In this case, the concentrators are radiated through in such a way that the light input opening is the actual light output opening of the concentrators. That is to say that the optical concentrators are radiated through in each case in the reverse direction. This allows a reduction in the divergence of the bundle of rays passing through she concentrator to be achieved. Furthermore, the concentrators are in each case suitable for mixing the electromagnetic radiation passing through them. If, for example, the light guide is arranged downstream of a number of light sources which are suitable for generating light of different colours from one another, the optical concentrator can serve for mixing the colours. For example, the light from green, blue and red light-emitting diode chips or light-emitting diodes can be mixed to form a particularly homogeneous white light.

The first concentrator—in the first portion of the light guide—is preferably formed in such a way that it can receive particularly diverging radiation and reduces its divergence to such an extent that the second concentrator can in turn receive this radiation of lower divergence. The second concentrator is then preferably suitable for further reducing the divergence of the bundle of rays. The second concentrator may be adjoined in the same way by further concentrators.

According to at least one embodiment of the light guide, the side faces of the second portion are in this case evenly formed. That is to say that, similar to the side faces of the first portion, the side faces of the second portion have no macroscopic recesses, elevations or curvatures, but are formed macroscopically smooth.

According to at least one embodiment, the side faces of the second portion have a curvature. The second portion may in this case be formed in the manner of one of the following optical concentrators. A compound parabolic concentrator (CPC), a compound elliptic concentrator (CEC) or a compound hyperbolic concentrator (CHC).

According to at least one embodiment of the light guide, the first angles are between 100 and 180 degrees, preferably between 125 and 140 degrees.

According to at least one embodiment of the light guide, the second angles are between 90 and 140 degrees, preferably between 95 and 135 degrees.

According to at least one embodiment of the light guide, the length of the first portion of the light guide is at most 20 percent of the total length of the light guide. The length of the first portion is preferably at most 10 percent of the total length. The length of the first portion is in this case measured from the side of the light guide that has the light input face. The length of the light guide is then given by the distance of the light input face from a light output face of the light guide.

According to at least one embodiment of the light guide, the light input face is concavely formed. That is to say that the light input face bounds a recess which extends into the light guide. In this case, the recess may encompass the entire area of the light guide in which it is located. However, it is also possible for the recess to encompass only part of the area. Other parts of this area are then for example evenly formed.

The light input face preferably has a concave curvature. That is to say that the light input face bounds a region curved concavely into the light guide.

According to at least one embodiment, the light input face is spherically curved. That is to say that the light input face is given, at least in places, by part of a spherical surface.

According to at least one embodiment, the light input face has an elliptical curvature. The light input face is then given, at least in places, by part of the surface of an ellipse.

According to at least one embodiment, the light input face has an aspherical curvature. That is to say that the light input face is given, at least in places, by part of the surface of an asphere of revolution. An at least partially aspherically curved light input face in this case allows the radiation entering the light guide to refract as it passes through the light input face in a particularly defined manner as a result of the choice of form parameters of the asphere of revolution.

At least according to one embodiment, the light input face is biconically shaped. The light input face may in this case be curved both spherically and/or aspherically.

A curved light input face one the one hand allows the proportion of the electromagnetic radiation emitted by a radiation source that is coupled in to be maximized. On the other hand, the radiation can be refracted in such a way that it can remain as long as possible in the light guide. For example, the radiation entering is refracted at angles to a side face of the light guide that satisfy the condition for total reflection at the side face. In this way, the proportion of the radiation coupled in that does not leave the light guide through the side face but through a light output face provided for light output can be optimized. Furthermore, with the aid of a curved light input face, the divergence of the bundle of rays can be reduced even as it enters the light guide.

According to at least one embodiment of the light guide, the light guide has a light output face. A large part of the radiation coupled into the light guide through the light input face leaves the light guide through the light output face. The light output face is preferably arranged on the side of the light guide that is opposite from the light input face. A large part of the radiation means that, for example, particularly divergent radiation can leave through one of the side faces before it reaches the light output face. However, a predominant part of the radiation coupled into the light guide leaves it through the light output face.

According to at least one embodiment of the light guide, the light output face is evenly formed. That is to say that it does not have any macroscopic recess, elevation or curvature.

According to at least one embodiment, the light output face has a curvature. That is to say that at least part of the face of the light guide that is intended for the coupling of electromagnetic radiation out of the light guide is curved. The curvature may in this case be concavely formed, that is to say into the light guide, or convexly formed, that is to say out of the light guide.

According to at least one embodiment, the light output face has one of the following curvatures: spherical, elliptical, aspherical, biconical, biconically spherical or biconically aspherical. Furthermore, it is possible for the light output face to be given by a free formed surface, which may for example have curvatures of higher order.

The curvature of the light output face allows the divergence of radiation leaving the light guide to be reduced.

Furthermore, it is possible with the aid of the curvature of the light output face to achieve a particularly uniform distribution of the radiation as it leaves the light guide. Consequently, an area which is illuminated by electromagnetic radiation leaving the light guide can be illuminated particularly uniformly.

According to at least one embodiment of the light guide, the light guide is formed as a solid body. This may mean, for example, that the light guide is formed as one part from a uniform material. The light guide preferably contains a dielectric material, which is at least partially transparent to the electromagnetic radiation coupled into the light guide. Formed as a solid body can also mean that the light guide bounded by the light input face, the side faces and the light output face is filled with a material. The filling material may in this case differ from the material of the side faces and/or the material from which the light input face and light output face are formed.

According to at least one embodiment, the material has a refractive index of greater than 1.0. Reflection of radiation at the side faces of the light guide then preferably takes place on the basis of total reflection. The material preferably has a refractive index, of greater than 1.3, particularly preferably a refractive index of between 1.4 and 1.7.

According to at least one embodiment, the material is given by a plastic. The material preferably comprises one of the following plastics: PMMA (polymethylmethacrylates), polycarbonate, PMMI (poly-N-methyl methacrylimides) or COC (cycloolefin copolymer).

Furthermore, an optoelectronic component is provided. According to at least one embodiment, the optoelectronic component has a radiation source and a light guide. The radiation source is a component which is suitable for generating electromagnetic radiation. For example, the radiation source is one or more light-emitting diode chips or one or more light-emitting diodes.

The light guide is an optical component which is suitable for guiding electromagnetic radiation from a light input face to a light output face. The guidance of the electromagnetic radiation preferably takes place in this case on the basis of reflections—for example total reflections—at side faces of the light guide. The side faces connect the light input face to the light output face. Therefore, a light guide is not to be understood in particular as meaning a lens. For example, the light guide may be a light guide such as is described in at least one of the embodiments presented above.

The light input face of the light guide is in this case preferably unevenly formed. The unevenness of the light input face relates in particular to macroscopic unevennesses. That is to say that the light input face is not formed as a planar face, but has for example at least one macroscopic recess and/or macroscopic elevation. The unevenness of the light input face is preferably chosen here such that the coupling of light into the light guide is improved on account of the unevenness. The light guide preferably has a single light input face.

According to at least one embodiment of the optoelectronic component, electromagnetic radiation emitted by the radiation source is refracted as it passes through the light input face. That is to say that a reflection of the radiation with enters the light guide takes place at the light input face. A large part of the radiation coupled into the light guide is preferably refracted at the light input face. The refraction of the radiation at the light input face allows the effect to be achieved that electromagnetic radiation entering the light guide is deflected onto the side faces of the light guide at such angles that it satisfies the condition for total reflection. The radiation can in this way be kept in the light guide and it is not transmitted through the side faces. There is preferably a gap between the light input face of the light guide and the radiation output face of the radiation source. The gap may be filled for example with air.

According to at least one embodiment of the optoelectronic component, the light input face is concavely formed. This also means that the light input face bounds a recess which extends into the light guide. For example, the light input face may have one of the following concave curvatures: spherical, elliptical, aspherical, biconical, biconically spherical or biconically aspherical.

According to at least one embodiment of the optoelectronic component, the light input face at least partially spans the radiation source. The light input face preferably completely encloses the radiation, source. That is to say that the concave region of the light guide that is bounded by the light input face is fitted over the radiation source in the manner of a cover. The radiation source is therefore in this case enclosed by the light input face. In this way, all the radiation emitted by the radiation source can impinge on the light input face of the light guide. As described above, the light guide is in this case preferably formed as a solid body.

According to at least one embodiment of the optoelectronic component, the radiation source is given by one of the following optoelectronic components: light-emitting diode or light-emitting diode chip or VCSEL (Vertical Cavity Surface Emitting Laser).

The light guide described here and the optoelectronic component described here are explained in more detail below on the basis of exemplary embodiments and the associated figures.

BRIEF DESCRIPTION OF THE DRAWINGS

In the exemplary embodiments and figures, components that are the same or have the same effect are in each case provided with the same reference numerals. The elements

DETAILED DESCRIPTION

Figure 1A:
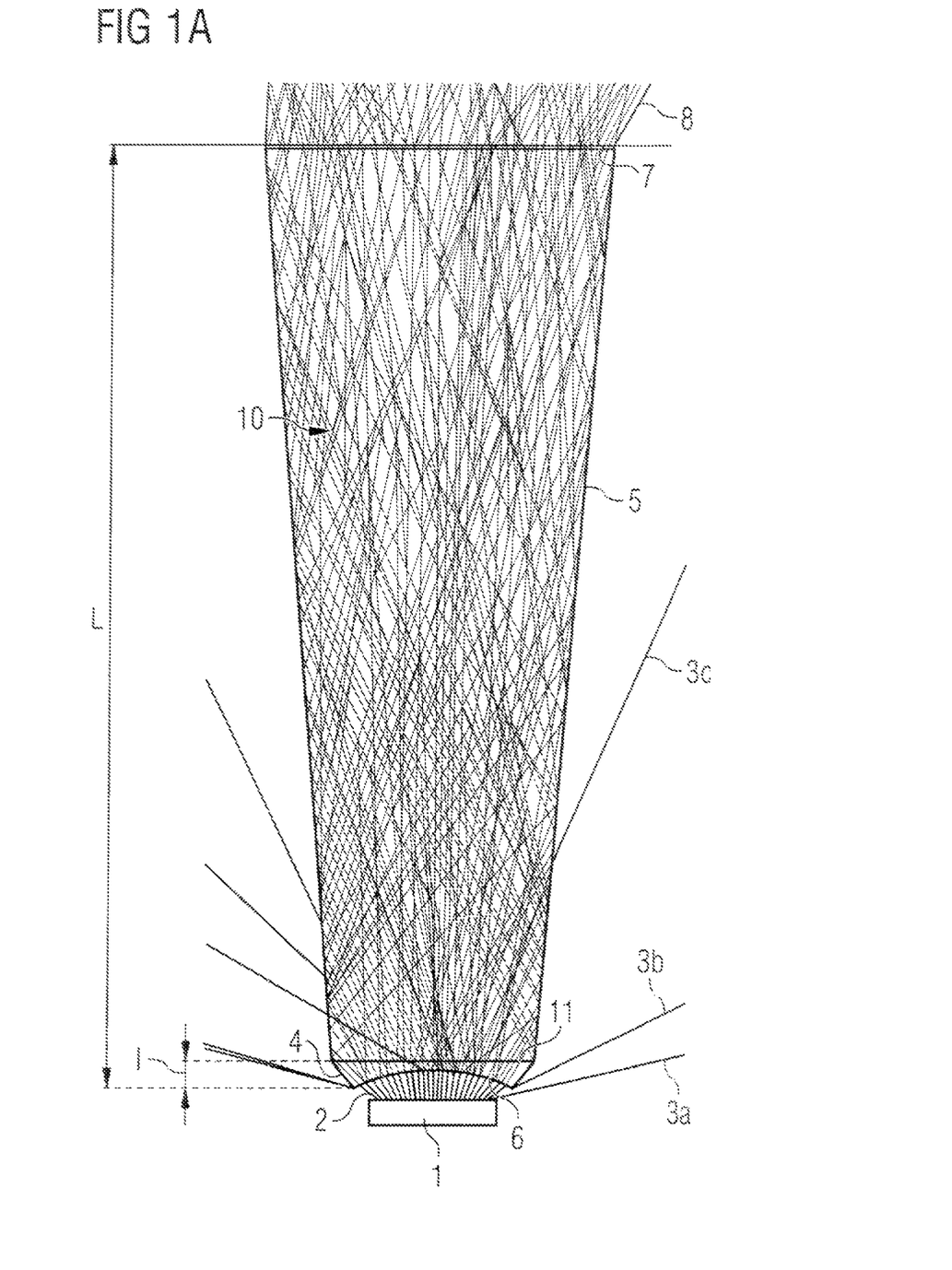
FIG. 1A shows a schematic sectional representation of a first exemplary embodiment of the component described.

FIG. 1A shows a schematic sectional representation of a first exemplary embodiment of the optoelectronic component described here.

The component has a radiation source 1. The radiation source 1 is, for example, one or more light-emitting diodes or one or more light-emitting diode chips. The radiation source 1 preferably has four light-emitting diode chips, which are arranged in two rows of two chips each.

A light-emitting diode chip of the radiation source 1 preferably has a light coupling-out face, through which a large part of the electromagnetic radiation emitted by the light-emitting diode chip is coupled out. The light coupling-out face is given for example by part of the surface of the light-emitting diode chip. The light coupling-out face is preferably given by a main face of the light-emitting diode chip that is arranged for example parallel to a series of epitaxial layers of the light-emitting diode chip which are suitable for generating electromagnetic radiation.

For this purpose, the series of epitaxial layers may have, for example, a pn junction, a double heterostructure, a single quantum well structure or, particularly preferably, a multiple quantum well structure. Within the scope of the application, the designation quantum well structure covers any structure in which charge carriers experience a quantization of their energy states by confinement. In particular, the designation quantum well structure does not imply any specification concerning the dimensionality of the quantization. It consequently covers, inter alia, quantum boxes, quantum wires and quantum dots and any combination of these structures.

The light-emitting diode chip is preferably a semiconductor light-emitting diode chip from which the growth substrate has been at least partially removed and on the surface of which that is facing away from the original growth substrate a carrier element has been applied.

In comparison with a growth substrate, the carrier element can be chosen relatively freely. A carrier element which is adapted with regard to its coefficient of thermal expansion particularly well to the radiation-generating series of epitaxial layers is preferably chosen. Furthermore, the carrier element may contain material which has particularly good thermal conducting properties. In this way, the heat generated during the operation of the light-emitting diode is dissipated particularly efficiently to the heat conducting element.

Such light-emitting diode chips produced by the removal of the growth substrate are often referred to as thin-film light-emitting diode chips and are preferably distinguished by the following features:

A reflective layer or series of layers which reflects at least part of the electromagnetic radiation generated in the series of epitaxial layers back into them is applied or formed on a first main face of the radiation-generating series of epitaxial layers that is facing towards the carrier element.

The series of epitaxial layers preferably has a thickness of at most twenty micrometers, particularly preferably of at most ten micrometers.

Furthermore, the series of epitaxial layers preferably includes at least one semiconductor layer with at least one area which has an intermixing structure. In the ideal case, this intermixing structure leads to an approximately ergodic distribution of the light in the series of epitaxial layers, that is to say it has as far as possible an ergodic, stochastic scattering behaviour.

A basic principle of a thin-film light-emitting diode chip is described for example in the document Schnitzer I, et al., "30% external quantum efficiency from surface textured LEDs", Applied Physics Letters, October 1993, vol. 63, pages 2174-2176, the disclosure of which concerning the basic principle of a thin-film light-emitting diode chip is hereby incorporated by reference.

A large part of the electromagnetic radiation 2 emitted by the radiation source 1 enters the light guide 10 through the preferably single light input face 6. In this case it is possible for a small part of particularly divergent radiation 3a to escape laterally in the gap 12 between the radiation source 1 and the light guide 10. The gap 12 may be filled for example with air.

The light guide 10 is formed for example as a solid body. For this purpose, the light guide comprises a dielectric material, preferably a plastic such as PMMA, polycarbonate, COC or PMMI. The light guide is transparent to the electromagnetic radiation 2 emitted by the radiation source 1.

The radiation 2 is preferably light in the visible frequency range. The refractive index of the dielectric material is preferably at least 1.3, particularly preferably between 1.4 and 1.7.

In the exemplary embodiment shown, the light input face 6 is formed as a concavely curved face. For example, at least parts of the light input face 6 have a concave spherical, elliptical or aspherical curvature. That is to say that at least parts of the light input face 6 are curved, in this way. The light input face 6 may also be biconically, biconically spherically or biconically aspherically shaped. The curvature of the light input face is chosen such that radiation 2 entering through the light input face 6 is for the most part refracted in such a way that the refracted radiation impinges on the side faces 4, 5 of the light guide at angles at which the condition for total reflection on the side faces 4, 5 is satisfied.

The light guide 10 is divided into two portions. The first portion is bounded by the side faces 4 of the light guide. The second portion is bounded by the side faces 5 of the light guide.

Figure 3:
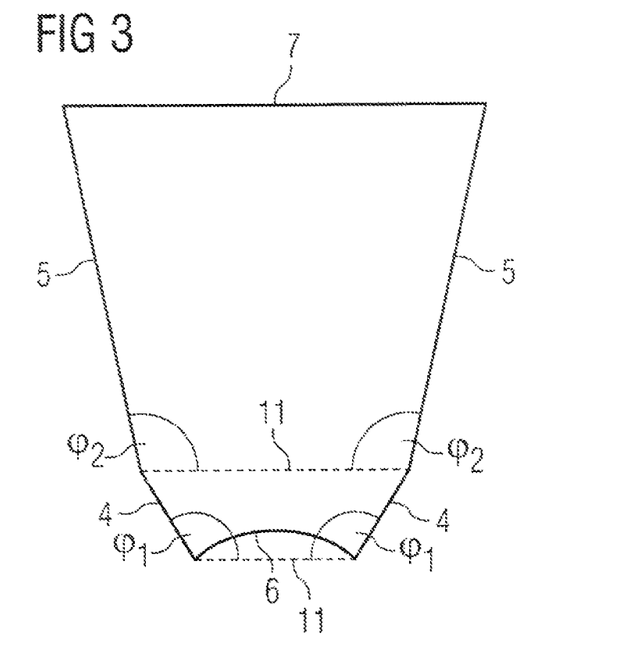
FIG. 3 shows a schematic sectional representation of a second exemplary embodiment of the light guide described here.

As FIG. 3 illustrates for example, the side faces 4 form a first angle $\phi_1$ with the cross-sectional area 11 of the light guide 10. The side faces 5 in the second portion of the light guide form a second angle $\phi_2$ with the cross-sectional area 11 of the light guide. Both the side faces 4 of the first portion and the side faces 5 of the second portion are evenly formed in the exemplary embodiment shown. It is also possible, however, for the first and second side faces to have a curvature. For instance, first and second side faces may be formed in the manner of one of the following optical elements: CPC, CHC or CEC.

The first angles $\phi_1$ are preferably greater than the second angles $\phi_2$. That is to say that the cross-sectional area 11 of the light guide 10 increases more in the first portion, which is arranged directly downstream of the light input face 6, with the distance from the light input face 6 than in the second portion of the light guide 10.

The first angles $\phi_1$ are preferably between 125 and 140 degrees.

In the second portion, in which the light guide 10 is bounded by the side faces 5, the cross-sectional area 11 of the light guide 10 does not increase as much. The second angles $\phi_2$ are preferably between 95 degrees and 135 degrees.

The greater increase of the cross-sectional area 11 in the first portion of the light guide ensures that even divergent radiation which is coupled into the light guide 10 through the light input race 6 satisfies the condition for total reflection at the side walls 4. Divergent radiation refers here to radiation which forms an angle with the cross-sectional area 11 of the light guide that deviates greatly from an angle of 90 degrees. Only a small proportion 3b of the radiation 2 coupled into the light guide 10 does not satisfy the condition for total reflection at the side faces 4 and leaves the light guide 10.

The electromagnetic radiation 2 coupled into the light guide 10 is partly reflected multiply at the side faces 4, 5 of the light guide 10 before it leaves the light guide through the light output face 7.

Only a small proportion 3c of the electromagnetic radiation coupled into the light guide 10 is divergent to such an extent that the condition for total reflection at the side faces 5 of the second portion cannot be satisfied and therefore leaves the light guide 10 before reaching the light output face 7.

The first portion of the light guide 10, which is bounded by the side faces 4, has a length l which is preferably at most twenty percent of the total length L, in particular preferably at most ten percent of the total length L of the light guide 10.

The predominant part of the radiation 2 coupled into the light guide 10 leaves it through the light output face 7. In the exemplary embodiment shown, the light output face 7 is evenly formed. However, it is also possible for the light output face to have, for example, a spherical, elliptical or aspherical curvature. The curvature of the light output face here is preferably convex. The curvature of the light output face 7 can, for example, further reduce the divergence of the radiation 8 passing through the light output face 7.

The light guide is preferably formed as one part. That is to say that the first and second portions of the light guide 10 are integrally produced.

Figure 1B:
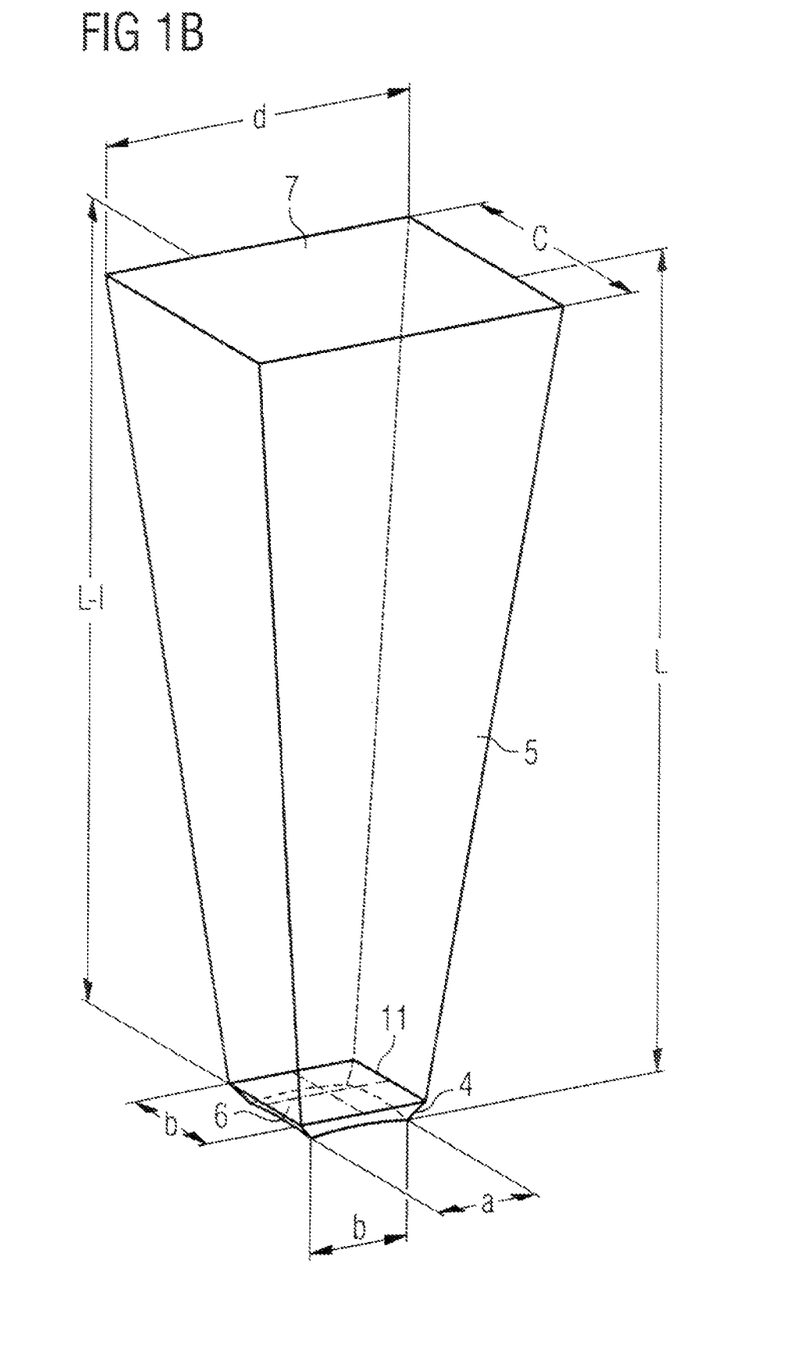
FIG. 1B shows a schematic perspective representation of the first exemplary embodiment of the light guide described here.

FIG. 1B snows a schematic perspective representation of the light guide 10. The total length L of the light guide 10 is preferably between 5 and 50 mm, particularly preferably between 15 and 30 mm. The length of the first portion 1 of the light guide 10 is preferably between 2 and 30 percent of the total length L, particularly preferably between 10 and 20 percent of the total length L. In the exemplary embodiment of FIG. 1B, L is 20 mm, l is 5 mm.

The light input face 6 is arranged in a square area with an edge length a of 2.4 mm. The cross-sectional area 11 in the transition from the first portion to the second portion of the light guide is 3.2 mm times 3.2 mm. That is to say that the edge length b there is 3.2 mm. In this exemplary embodiment, the light output face 7 is rectangular. The first edge length c is 6.8 mm. The second edge length d is 7.8 mm.

Figures 2A, 2B:
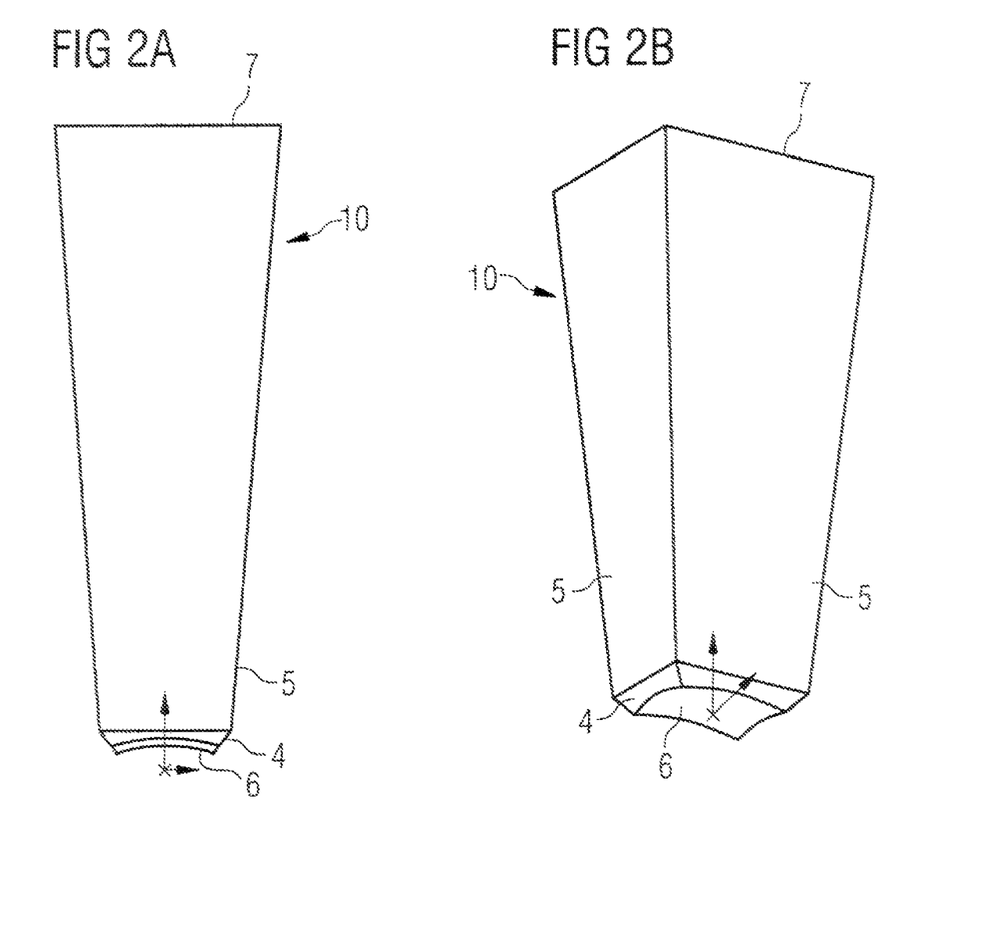
FIG. 2A shows a schematic sectional representation of a first exemplary embodiment of the light guide described here.
FIG. 2B shows a schematic perspective representation of the first exemplary embodiment of the light guide described here.

FIGS. 2A and 2B show a schematic sectional representation and the associated basic perspective diagram of the light guide described here. As the figures reveal, the two portions of the light guide 10, which are bounded by the side faces 4 and 5, respectively, are configured in each case as frustums of a pyramid with a rectangular or square base area. Both portions form in each case an optical concentrator, which is radiated through in the reverse direction. The side faces 4 of the first portion are suitable for the total reflection of particularly divergent radiation. The particularly divergent radiation is reflected from the side faces 4 into the second portion, which is bounded by the side faces 5.

Figure 4:
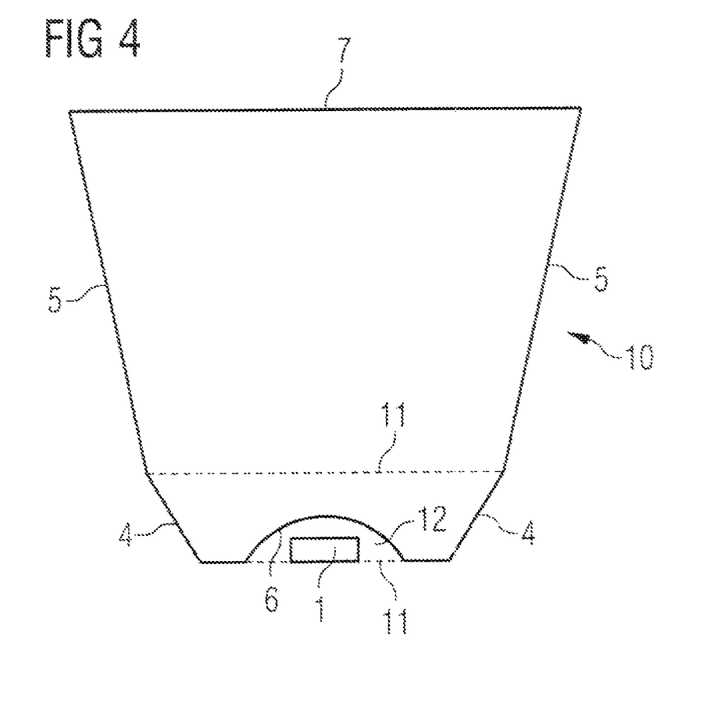
FIG. 4 shows a schematic sectional representation of a second exemplary embodiment of the optoelectronic component described here.

FIG. 4 shows a schematic sectional representation of a second exemplary embodiment of the optoelectronic component described here. In this case, the light input face 6 completely spans the radiation source 1. The light input face 6 is configured as a recess in the surface of the light guide 10 that is facing away from the light output face 7. Between the radiation source 1 and the light input face 6 there is a gap 12, which may be filled for example with air. It is also possible, however, for the gap 12 to be filled with a transparent casting material, the refractive index of which is less than that of the material from which the light guide 10 is formed.

In the exemplary embodiment of FIG. 4, apart from its optical properties, the light guide 10 represents mechanical protection for the radiation source 11.

The invention is not restricted by the description based on the exemplary embodiments. Rather, the invention comprises any novel feature and any combination of features, which includes in particular any combination of features in the patent claims, even if this feature or this combination is not itself explicitly specified in the patent claims or exemplary embodiments.

The invention claimed is:
1. Optoelectronic component having:
a radiation source; and
a light guide with an uneven light input face and a light output face wherein the total length of the light guide is given by the distance between the light input face and the light output face, a large part of the electromagnetic radiation emitted by the radiation source being refracted as it enters the light guide and a large part of the electromagnetic radiation coupled into the light guide through the light input face leaves the light guide through the light output face,
wherein the light input face of the light guide completely encloses the radiation source,
the light guide has a first portion and a second portion, wherein a length of the first portion of the light guide is given by the distance between the light input face and an end face of the first portion of the light guide, said end face being arranged opposite to the light input face between the light input face and the light output face, wherein the length of the first portion is at most 20% of the total length (L) of the light guide,
the first portion and the second portion of the light guide are in the form of a frustum of a pyramid or a frustum of a cone,
the light guide is a solid body,
the light input face is configured as a recess in the solid body,
a gap is arranged between the radiation source and the light input face which is filled with air, and
the radiation source is given by one of the following optoelectronic devices: light-emitting diode, light-emitting diode chip, VCSEL.

2. Optoelectronic component according to claim 1, in which the light input face is concavely formed.

3. Optoelectronic component according to claim 1, in which the light input face has one of the following curvatures: spherical, elliptical, aspherical, biconical, biconically aspherical or biconically spherical.

4. Optoelectronic component according to claim 1, in which the first portion is arranged directly downstream of the light input face.

5. Optoelectronic component according to claim 1, further comprising even side faces arranged directly downstream of the light input face,
- wherein a cross-sectional area of the light guide increases with the distance from the light input face, and the cross-sectional area increases more in a first portion than in a second portion of the light guide, and
- in which the side faces of the light guide in the first portion each form an angle ($\phi_1$) with the cross-sectional area of the light guide.

6. Optoelectronic component according to claim 5, in which the side faces of the second portion are even.

7. Optoelectronic component according to claim 5, in which the side faces of the second portion have a curvature.

8. Optoelectronic component according to claim 7, in which the side faces of the second portion are formed, at least in places, in the manner of one of the following optical elements: CPC, CEC or CHC.

9. Optoelectronic component according to claim 5, in which the side faces of the second portion each form a second angles ($\phi_2$) with the cross-sectional area of the light guide.

10. Optoelectronic component according to claim 9, in which the first angles ($\phi_1$) are greater than the second angles ($\phi_2$).

11. Optoelectronic component according to claim 9, in which the first angles ($\phi_1$) are between 125° and 140°.

12. Optoelectronic component according to claim 11, in which the second angles ($\phi_2$) are between 95° and 135°.

13. Optoelectronic component according to claim 1, in which the length of the first portion is at most 10% of the total length (L) of the light guide.

14. Optoelectronic component according to claim 1, in which the light output face has a curvature.

15. Optoelectronic component according to claim 14, in which the light output face has a convex curvature.

16. Optoelectronic component according to claim 14, in which the light output face has one of the following curvatures: spherical, elliptical, aspherical, biconical, biconically aspherical or biconically spherical.

17. Optoelectronic component according to claim 1, in which the light output face is formed by a freeform surface.

18. Optoelectronic component according to claim 1, in which the light output face is even.

19. Optoelectronic component according to claim 1, in which the light guide contains a transparent material.

20. Optoelectronic component according to claim 19, in which the transparent material has a refractive index of greater than 1.

21. Optoelectronic component according to claim 20, in which the transparent material has a refractive index of greater than 1.3.

22. Optoelectronic component according to claim 19, in which the transparent material comprises at least one of the following materials: PMMA, polycarbonate, PMMI or COC.

23. Optoelectronic component according to claim 1, wherein the light guide reduces the divergence of a bundle of rays that passes through the light guide.

24. An optoelectronic component comprising:
- a radiation source comprising one of the following optoelectronic devices: light-emitting diode, light-emitting diode chip, a vertical cavity surface emitting laser; and
- a light guide which is a solid body with an uneven light input face configured as a recess in the solid body and a light output face, wherein a large part of the electromagnetic radiation emitted by the radiation source is refracted as it enters the light guide and a large part of the electromagnetic radiation coupled into the light guide through the light input face leaves the light guide through the light output face, the light input face separated from the radiation source by a gap which is filled with air;
- wherein the light guide comprises:
  - a first portion in the form of a frustum of a pyramid or a frustum of a cone in which side face(s) of the light guide in the first portion form a first angle with the cross-sectional area of the light guide; and
  - a second portion in the form of a frustum of a pyramid or a frustum of a cone in which side face(s) of the light guide in the second portion form a second angle with the cross-sectional area of the light guide, the first angle being greater than the second angle;
  - wherein the distance between the light input face and a transition between the first portion of the light guide and the second portion of the light guide is at most 20% of the distance between the light input face and the light output face.

25. The optoelectronic component of claim 24, wherein the light input face of the light guide completely encloses the radiation source.

* * * * *